(12) United States Patent
Ouderkirk et al.

(10) Patent No.: US 7,296,916 B2
(45) Date of Patent: Nov. 20, 2007

(54) ILLUMINATION ASSEMBLY AND METHOD OF MAKING SAME

(75) Inventors: Andrew J. Ouderkirk, Woodbury, MN (US); Michael A. Meis, Stillwater, MN (US); Hung T. Tran, Woodbury, MN (US); Joseph A. Hoffman, Minneapolis, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 11/018,961

(22) Filed: Dec. 21, 2004

(65) Prior Publication Data

US 2006/0131596 A1   Jun. 22, 2006

(51) Int. Cl.
*F21V 29/00* (2006.01)
*H01L 33/00* (2006.01)

(52) U.S. Cl. ..................................... 362/373

(58) Field of Classification Search ............... 362/19, 362/608, 609, 612, 555, 559, 561, 545, 547, 362/294, 341, 345, 800, 373, 227; 257/705, 257/706, 707, 712, 720, 98, 99
See application file for complete search history.

(56) References Cited

U.S. PATENT DOCUMENTS

| | | | |
|---|---|---|---|
| 4,742,432 A | 5/1988 | Thillays et al. | |
| 4,774,434 A | 9/1988 | Bennion | |
| 5,727,310 A | 3/1998 | Casson et al. | |
| 5,857,767 A | 1/1999 | Hochstein | |
| 5,882,774 A | 3/1999 | Jonza et al. | |
| 5,998,935 A | 12/1999 | Marcotte | |
| 6,080,467 A | 6/2000 | Weber et al. | |
| 6,130,646 A | 10/2000 | Jang | |
| 6,164,789 A | 12/2000 | Unger et al. | |
| 6,274,924 B1 | 8/2001 | Carey et al. | |
| 6,362,964 B1* | 3/2002 | Dubhashi et al. | 361/707 |
| 6,428,189 B1* | 8/2002 | Hochstein | 362/373 |
| 6,452,217 B1 | 9/2002 | Wojnarowski et al. | |

(Continued)

FOREIGN PATENT DOCUMENTS

EP  328088 A  8/1989

(Continued)

OTHER PUBLICATIONS

Lumileds Lighting U.S., "LLC, Luxeon® Emitter Assembly Information", application brief AB10, [retrieved from internet Dec. 17, 2004], URL <lumileds.com/pdfs/AB10.pdf>, 2004, 12 pages.

(Continued)

*Primary Examiner*—Sandra O'Shea
*Assistant Examiner*—James W. Cranson, Jr.
(74) *Attorney, Agent, or Firm*—Jay R. Pralle

(57) ABSTRACT

An illumination assembly including a thermally conductive substrate, a reflective layer proximate a first major surface of the thermally conductive substrate, a patterned conductive layer positioned between the reflective layer and the first major surface of the thermally conductive substrate and electrically isolated from the thermally conductive substrate, and at least one LED including a post that is attached to the thermally conductive substrate is disclosed. The at least one LED can be thermally connected to the thermally conductive substrate through the post and electrically connected to the patterned conductive layer.

25 Claims, 2 Drawing Sheets

U.S. PATENT DOCUMENTS

| | | |
|---|---|---|
| 6,498,355 B1 | 12/2002 | Harrah et al. |
| 6,531,230 B1 | 3/2003 | Weber et al. |
| 6,541,800 B2 | 4/2003 | Barnett et al. |
| 6,714,348 B2 | 3/2004 | Dunn |
| 6,784,462 B2 * | 8/2004 | Schubert ................ 257/98 |
| 6,936,855 B1 * | 8/2005 | Harrah ................ 257/88 |
| 6,969,874 B1 * | 11/2005 | Gee et al. ................ 257/98 |
| 7,030,423 B2 * | 4/2006 | Chang et al. ............ 257/98 |
| 2001/0030866 A1 | 10/2001 | Hochstein |
| 2002/0117964 A1 | 8/2002 | Malone et al. |
| 2003/0057421 A1 | 3/2003 | Chen |
| 2003/0160256 A1 | 8/2003 | Durocher et al. |
| 2004/0012958 A1 | 1/2004 | Hashimoto et al. |
| 2004/0042212 A1 | 3/2004 | Du et al. |
| 2004/0135162 A1 | 7/2004 | Chin et al. |
| 2004/0218388 A1 | 11/2004 | Suzuki |
| 2004/0228106 A1 | 11/2004 | Stevenson et al. |
| 2004/0228107 A1 | 11/2004 | Lee et al. |
| 2004/0233665 A1 | 11/2004 | West et al. |
| 2005/0001537 A1 | 1/2005 | West et al. |
| 2006/0131601 A1 * | 6/2006 | Ouderkirk et al. ............ 257/99 |
| 2006/0131602 A1 * | 6/2006 | Ouderkirk et al. .......... 257/100 |
| 2006/0138621 A1 | 6/2006 | Bogner et al. |
| 2006/0198147 A1 | 9/2006 | Ge |

FOREIGN PATENT DOCUMENTS

| | | |
|---|---|---|
| EP | 328088 B | 5/1994 |
| EP | 1 467 414 | 10/2004 |
| WO | WO 00/69000 | 11/2000 |
| WO | WO 03/052838 | 6/2003 |

OTHER PUBLICATIONS

Lumileds Lighting U.S., LLC, "Luxeon® Star power light source", [retrieved from internet Dec. 17, 2004], URL <lumileds.com/pdfs/DS23.pdf>, Nov. 2004, 15 pages.

Schultz et al., U.S. Appl. No. 10/727,220, "Illumination Assembly", filed Dec. 2, 2003.

Epstein et al., U.S. Appl. No. 10/858,539, "LED Array Systems", filed Jun. 1, 2004.

Ouderkirk et al., U.S. Appl. No. 10/982,651, "Illumination Assembly Using Circuitized Strips", filed Nov. 5, 2004.

Ouderkirk et al., U.S. Appl. No. 11/018,605, "Illumination Assembly and Method of Making Same", filed Dec. 21, 2004.

Ouderkirk et al., U.S. Appl. No. 11/018,608, "Illumination Assembly and Method of Making Same", filed Dec. 21, 2004.

* cited by examiner

ILLUMINATION ASSEMBLY AND METHOD OF MAKING SAME

RELATED PATENT APPLICATIONS

The following co-owned and copending U.S. patent applications are incorporated herein by reference: ILLUMINATION ASSEMBLY AND METHOD OF MAKING SAME Ser. No. 11/018,608; ILLUMINATION ASSEMBLY AND METHOD OF MAKING SAME Ser. No. 11/018,605.

BACKGROUND

The present disclosure generally relates to a lighting or illumination assembly. More particularly, the present disclosure relates to a lighting or illumination assembly that uses an array of light emitting diodes (LEDs).

Illumination assemblies are used in a variety of diverse applications. Traditional illumination assemblies have used lighting sources such as incandescent or fluorescent lights, for example. More recently, other types of light emitting elements, and light emitting diodes (LEDs) in particular, have been used in illumination assemblies. LEDs have the advantages of small size, long life, and low power consumption. These advantages of LEDs make them useful in many diverse applications.

For many lighting applications, it is desirable to have one or more LEDs supply the required light intensity and/or distribution. For example, several LEDs can be assembled in an array having small dimensions to provide a high illuminance in a small area, or the LEDs can be distributed over a larger area to provide a broader and more uniform illuminance.

LEDs in an array are commonly connected to each other and to other electrical systems by mounting the LEDs onto a printed circuit board substrate. LEDs may be populated onto a substrate using techniques that are common to other areas of electronics manufacturing, e.g., locating components onto circuit board traces, followed by bonding the components to the substrate using one of a number of known technologies, including wave soldering, reflow soldering, and attachment using conductive adhesives.

Common LED packages used to hold LED die include one or more LEDS mounted in a ceramic or plastic package, with electrical connections provided through wires or solder bonds such as surface mounted packages or T-1 3/4-type "jellybean" packages, etc. However, these techniques and designs sometimes provide poor thermal conductivity from the LED package to a heat sink, and the circuitized substrates used can be expensive and sometimes provide poor light reflectivity.

High thermal conductivity can be important for increasing the light output of an LED and extending its operating lifetime. Further, the reflectivity of the substrate can also be important in applications where the LED illuminates an optical cavity and a significant fraction of the light emitted by the LED reflects off the circuit substrate inside the optical cavity.

SUMMARY

The embodiments described herein are particularly useful for the manufacture and use of LED arrays that are utilized for lighting purposes or for information display.

In one aspect, the present disclosure provides an illumination assembly that includes a thermally conductive substrate including a first major surface, and a reflective layer proximate the first major surface of the thermally conductive substrate. The assembly also includes a patterned conductive layer positioned between the reflective layer and the first major surface of the thermally conductive substrate and electrically isolated from the thermally conductive substrate, and at least one LED including a post that is attached to the thermally conductive substrate. The at least one LED is thermally connected to the thermally conductive substrate through the post and electrically connected to the patterned conductive layer.

In another aspect, the present disclosure provides a method of making an illumination assembly, including providing a thermally conductive substrate including a first major surface, and positioning a patterned conductive layer proximate the first major surface of the thermally conductive substrate such that the patterned conductive layer is electrically isolated from the thermally conductive substrate. The method further includes positioning a reflective layer such that the patterned conductive layer is between the reflective layer and the first major surface, providing at least one LED including a post, and attaching the at least one LED to the thermally conductive substrate such that the at least one LED is adjacent the reflective layer. The at least one LED is thermally connected to the thermally conductive substrate through the post and electrically connected to the patterned conductive layer.

In another aspect, the present disclosure provides a display including an illumination assembly. The assembly includes a thermally conductive substrate including a first major surface, and a reflective layer proximate the first major surface of the thermally conductive substrate. The assembly further includes a patterned conductive layer positioned between the reflective layer and the first major surface of the thermally conductive substrate and electrically isolated from the thermally conductive substrate, and at least one LED including a post that is attached to the thermally conductive substrate. The at least one LED is thermally connected to the thermally conductive substrate through the post and electrically connected to the patterned conductive layer. The display further includes a spatial light modulator optically coupled to the illumination assembly, where the spatial light modulator includes a plurality of controllable elements operable to modulate at least a portion of light from the illumination assembly.

The above summary of the present disclosure is not intended to describe each disclosed embodiment or every implementation of the present disclosure. The Figures and Detailed Description that follow more particularly exemplify illustrative embodiments.

DETAILED DESCRIPTION

The present disclosure is applicable to illumination assemblies, and is more particularly applicable to illumination assemblies that provide illumination using LEDs. The illumination assemblies disclosed herein may be used for general lighting purposes, e.g., to illuminate an area, or for providing information to a viewer by selective illumination of different areas of the assembly as in an information display. Such assemblies are suitable for use in backlight displays, signs, and other lighting applications that require a significant amount of light.

The illumination assemblies of the present disclosure include an LED that is designed to be attachable to a substrate using a number suitable techniques, e.g., ultrasonic welding, press-fitting, piercing, screwing, etc. The substrates are thermally conductive such that heat can be conducted away from the LED. In some embodiments, the substrates are also electrically conductive, thereby providing a circuit pathway for the LED. Further, in some embodiments, the assemblies can include a reflective layer proximate a major surface of the substrate to reflect at least a portion of light emitted by the LED. Further, some embodiments include an LED having a post that can provide a direct thermal connection to the substrate. In an exemplary embodiment, this direct thermal connection can allow a portion of heat generated by the LED to be directed away from the LED and into the substrate in a direction substantially orthogonal to a major surface of the substrate, thereby reducing the amount of generated heat that is spread laterally away from the LED.

Figure 1:
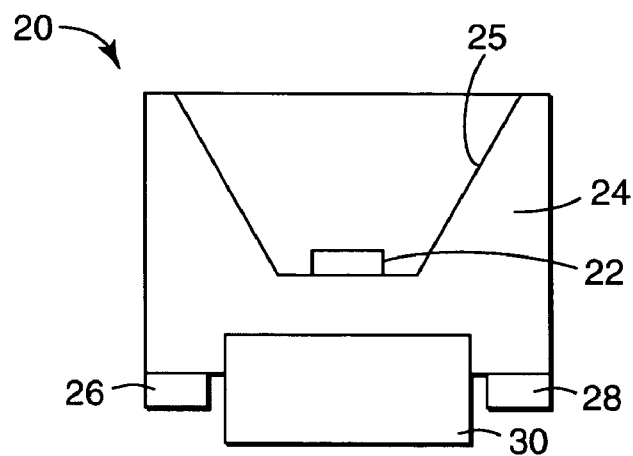
FIG. 1 is a schematic cross-section view of one embodiment of an LED.

FIG. 1 is a schematic cross-section view of one embodiment of an LED 20. The LED 20 includes a die 22 mounted within an LED body 24 that includes a reflective surface 25. The LED 20 also includes a first electrode 26 and a second electrode 28 that are both electrically connected to the die 22, and a post 30.

As used herein, the terms "LED" and "light emitting diode" refer generally to light emitting semiconductor elements with contact areas for providing power to the diode. Different forms of inorganic semiconductor light emitting diodes may be formed, for example, from a combination of one or more Group III elements and of one or more Group V elements (III-V semiconductor). Examples of III-V semiconductor materials that can be used in an LED include nitrides, such as gallium nitride or indium gallium nitride, and phosphides, such as indium gallium phosphide. Other types of III-V materials can also be used, as can inorganic materials from other groups of the periodic table.

The LEDs may be in packaged or non-packaged form, including, for example, LED dies, surface-mounted LEDs, chip-on-board LEDs and LEDs of other configurations. Chip-on-board (COB) refers to LED dies (i.e., unpackaged LEDs) mounted directly onto the circuit substrate. The term LED also includes LEDs packaged or associated with a phosphor where the phosphor converts light emitted from the LED to light at a different wavelength. Electrical connections to the LED can be made by wire bonding, tape automated bonding (TAB), or flip-chip bonding. The LEDs are schematically depicted in the illustrations, and can be unpackaged LED dies or packaged LEDs as described herein.

LEDs can be top emitting, such as those described in U.S. Pat. No. 5,998,935 (Shimizu et al.). Alternatively, LEDs can be side-emitting, such as those described in U.S. Patent Publication No. 2004/0,233,665 A1 (West et al.).

LEDs can be selected to emit at any desired wavelength, such as in the red, green, blue, ultraviolet, or infrared spectral regions. In an array of LEDs, the LEDs can each emit in the same spectral region, or can emit in different spectral regions. Different LEDs may be used to produce different colors where the color of light emitted from the light emitting element is selectable. Individual control of the different LEDs leads to the ability to control the color of the emitted light. In addition, if white light is desired, then a number of LEDs emitting light of different colors may be provided, whose combined effect is to emit light perceived by a viewer to be white. Another approach to producing white light is to use one or more LEDs that emit light at a relatively short wavelength and to convert the emitted light to white light using a phosphor wavelength converter. White light is light that stimulates the photoreceptors in the human eye to yield an appearance that an ordinary observer would consider "white." Such white light may be biased to the red (commonly referred to as warm white light) or to the blue (commonly referred to as cool white light). Such light can have a color rendering index of up to 100.

The LED 20 of FIG. 1 may include any suitable LED die 22. For example, the LED die 22 can include distinct p- and n-doped semiconductor layers, substrate layers, buffer layers, and superstrate layers. The primary emitting surface, bottom surface, and side surfaces of the LED die 22 are shown in a simple rectangular arrangement, but other known configurations are also contemplated, e.g., angled side surfaces forming, for example, a truncated pyramid shape that can either be upright or inverted. Electrical contacts to the LED die are also not shown for simplicity, but can be provided on any of the surfaces of the die as is known.

Although the LED 20 is depicted as having one die 22, the LED 20 can include two or more dies 22, e.g., a red-emitting die, a green-emitting die, and a blue-emitting die. In some embodiments, the LED die 22 may be a flip-chip design such that both electrical contacts are on a bottom surface of the die 22. In such an embodiment, any suitable technique may be used to electrically connect the die 22 to the first and second electrodes 26, 28 of the LED 20.

Figure 2:
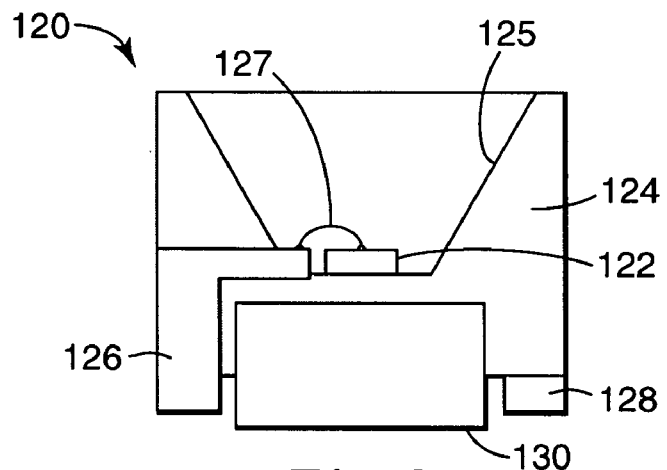
FIG. 2 is a schematic cross-section view of another embodiment of an LED.

In an alternative embodiment, the LED 20 may include a wire bond LED die 22. For example, FIG. 2 is a schematic cross-section view of and LED 120 that includes a one-wire bond LED die 122. The die 122 is electrically connected to a first electrode 126 through a wire 127 that is attached to a top surface of the die 122. A bottom surface of the die 122 is electrically connected to a second electrode 128 of the LED 120. In some embodiments, the LED die 122 can also have two or more wire bonds on any suitable surface or multiple surfaces of the die 122 that electrically connects the die 122 to the first and/or second electrodes 126, 128 and/or post 130. Any suitable wire or wires may be used to connect the die 122 to the first electrode 126. Further, any suitable technique may be used to attach the wire 127 to the die 122 and the first electrode 126. The LED 120 also includes an LED body 124 including a reflector 125, and a post 130. All of the design considerations and possibilities described herein with respect to the LED die 22, body 24, first and second electrodes 26, 28, and the post 30 of the embodiment illustrated in FIG. 1 apply equally to the LED die 122, body 124, first and second electrodes 126, 128, and the post 130 of the embodiment illustrated in FIG. 2.

Returning to FIG. 1, the LED body 24 includes reflective surface 25 that captures edge-emitted light from the LED die 22 and bends it forward. Any suitable material or materials may be used to form the LED body 24, e.g., metal, polymeric, etc. The reflective surface 25 may be specularly or diffusely reflective. In some embodiments, the reflective surface 25 may include a multi-layer polymer reflective film such as Vikuiti™ ESR film available from 3M Company, St. Paul, Minn.

The LED 20 also includes a post 30 that is thermally connected to the LED die 22. The post 30 can act as a low thermal resistance pathway for heat to be directed from the die 22 and out of the LED 20. The post 30 may be in contact with the die 22. Alternatively, the post 30 may be thermally connected to the die 22 through a thermally conductive adhesive or other material.

Any suitable material or materials may be used to form the post 30. In some embodiments, the post 30 includes a thermally conductive material, e.g., copper, nickel, gold, aluminum, tin, lead, silver, indium, zinc oxide, beryllium oxide, aluminum oxide, sapphire, diamond, aluminum nitride, silicon carbide, graphite, magnesium, tungsten, molybdenum, silicon, polymeric binders, inorganic binders, glass binders, and combinations thereof. The post 30 may also contain a working fluid for higher heat transfer rates. The post 30 may thus be considered a heat pipe, where the fluid transport is by capillary flow or two-phase liquid/boiling system. Further, in some embodiments, the post 30 may be electrically conductive. Any suitable electrically conductive material or materials may be used to form electrically conductive post 30, e.g., copper, nickel, gold, aluminum, tin, lead, silver, indium, and combinations thereof. In an exemplary embodiment, the post 30 may be both thermally and electrically conductive.

Further, the electrically conductive post 30 can be segmented to provide electrical isolation of parts of the post 30. It may be preferred that such segmentation is done in the longitudinal manner so each segment has good thermal conductivity. For example, a cylindrical post could be composed of two half-cylinders of thermally and electrically conductive material, e.g., aluminum, laminated together with a dielectric layer or region interposed between them to form a highly thermally conductive post along the length but with relatively limited thermal conductivity across the post diameter and with no electrical conductivity across the post diameter. More than two segments of the post are possible as well.

The post 30 can take any suitable size or shape. In some embodiments, the post 30 can take a cylindrical shape. Alternatively, the post 30 can take a tapered shape. Further, in some embodiments, the post 30 may include one or more threads as is further described herein. Although the post 30 is depicted as including a single post or unitary body, the post 30 can include two or more posts, each in contact with the thermally conductive substrate 12. In some embodiments, the post 30 may include one or more protuberances that may aid in mounting the LED 20 to a substrate.

The LED body 24 may be permanently attached to the post 30 using any suitable technique, e.g., adhering, bonding, welding, etc. In some embodiments, the post 30 may be integral with the LED body 24. Alternatively, the LED body 24 may be removably attached to the post 30. Any suitable technique may be used to removably attach the LED body 24 to the post 30. For example, the post 30 may include one or more threads, and the LED body 24 may also include one or more threads such that the body 24 may be threaded onto the post 30. Alternatively, the LED body 24 may be friction-fit onto the post 30.

In general, LEDs can be connected to power sources and substrates using conventional circuit boards and films. While LEDs share many of the same requirements as most other electronic components, there are differences. First, LEDs can be expensive, and the most cost-effective designs for building lighting systems using LEDs can have high junction to heat sink thermal resistance, which can increase thermal degradation of the LED. Second, LEDs often illuminate an optical cavity, where the light may experience several reflections off the circuit board substrate.

To help prevent light absorption in the assembly, circuit substrates may be manufactured by coating a circuit board with a highly reflective coating, e.g., a titania filled coating or a reflective film. However, both of these types of coatings need to be patterned for the LED to make electrical and thermal contact with the circuit board through the coating. This patterning of the reflective coating or film can be expensive and may not provide good thermal conductivity from the LED to the circuit board substrate An alternative circuit board substrate is one where the mounting of the LED to the circuit also makes good thermal contact with the circuit board and also patterns the reflector.

In general, the LEDs of the present disclosure can be attached to a substrate using a number of suitable techniques, e.g., ultrasonic welding, RF welding, thermosonic welding, press-fitting, piercing, screwing, etc. Such LEDs are designed to be quickly and easily attached to various substrates.

Figure 3:
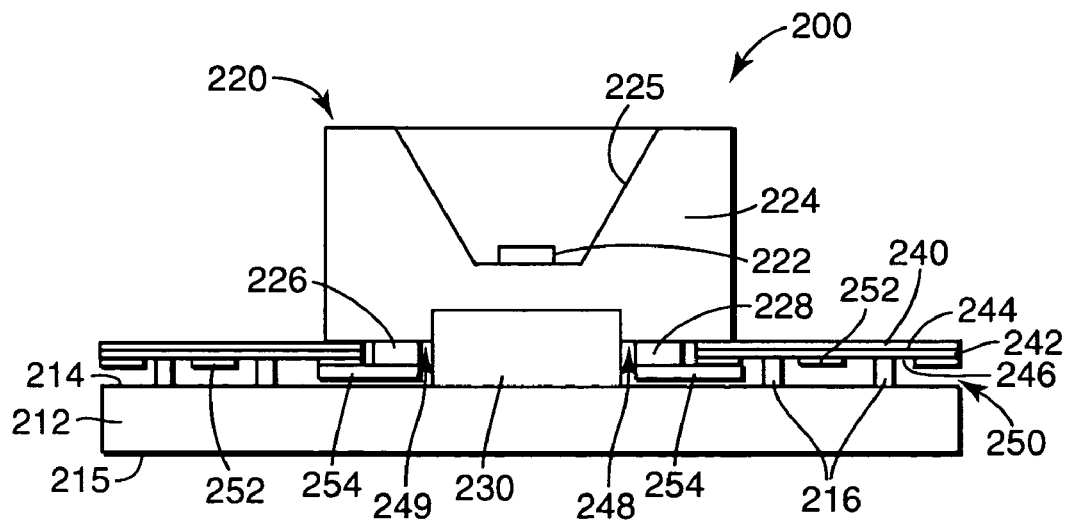
FIG. 3 is a schematic cross-section view of one embodiment of an illumination assembly.

For example, FIG. 3 is a schematic cross-section view of one embodiment of an illumination assembly 200. The assembly 200 includes a thermally conductive substrate 212, a reflective layer 240 including at least one aperture 248. The reflective layer 240 is positioned proximate a first major surface 214 of the thermally conductive substrate 212. The assembly 200 also includes a patterned conductive layer 250 positioned between the reflective layer 240 and the first major surface 214, and at least one LED 220. The assembly 200 further includes a support layer 242 having at least one aperture 249.

The thermally conductive substrate 212 includes the first major surface 214 and a second major surface 215. The substrate 212 may include any suitable material or materials that are thermally conductive, e.g., copper, nickel, gold, aluminum, tin, lead, silver, indium, zinc oxide, beryllium oxide, aluminum oxide, sapphire, diamond, aluminum nitride, silicon carbide, graphite, magnesium, tungsten, molybdenum, silicon, polymeric binders, inorganic binders, glass binders, polymers loaded with thermally conductive particles that may or may not be electrically conductive, capillary flow heat pipes, two-phase heat transport devices, and combinations thereof. In some embodiments, the substrate 212 can be weldable (e.g., ultrasonically weldable) to another material or materials, e.g., weldable to aluminum, copper, metal coated ceramic or polymer, or thermally conductive filled polymer. The substrate 212 can include any suitable size and shape.

In some embodiments, the thermally conductive substrate 212 may also be electrically conductive. Such an electrically conductive substrate may include any suitable electrically conductive material or materials, e.g., copper, nickel, gold, aluminum, tin, lead, silver, indium, and combinations thereof.

The thermally conductive substrate 212 can serve a combination of purposes, including making an electrical connection to the LED 220, providing a direct thermal pathway away from the LED 220, providing heat spreading laterally away from the LED 220, and providing electrical connections to other systems, for example.

In some embodiments, the thermally conductive substrate 212 can be flexible. In such embodiments, it may be preferred that the reflective layer 240 and the patterned conductive layer 240 are also flexible. A suitable flexible material having a polyimide insulative substrate with copper conductive layers thereon is 3M™ Flexible Circuits, available from 3M Company.

The thermally conductive substrate 212 can be a unitary material or, alternatively, one or more layers of material that, as a whole, provide a thermally conductive substrate. In some embodiments, the thermally conductive substrate 212 can include tabs or fins that are formed through the substrate 212 that provide increased heat dissipation due to the increased surface area. In other embodiments, the first and/or second major surfaces 214, 215 of the thermally conductive substrate 212 can be etched or provided with grooves to also provide greater surface area for cooling. Tabs can be formed in the substrate 212 such that they extend from the second major surface 216 of the thermally conductive substrate 212. Such tabs can increase convective cooling efficiency of the thermally conductive substrate 212 and can also decrease the heat transfer between LEDs.

Proximate the first major surface 214 of the thermally conductive substrate 212 is the reflective layer 240. In the illustrated embodiment, the reflective layer 240 is positioned on a first major surface 244 of the support layer 242. In general, at least a portion of light emitted by the at least one LED 220 can reflect off of the reflective layer 240 and be directed away from the substrate 212. It may be preferred that the reflective layer 240 reflects at least 80% of light incident thereon. It may be more preferred that the reflective layer 240 reflects at least 95% of light incident thereon. It may be even more preferred that the reflective layer 240 reflects at least 99% of light incident thereon. The reflective layer 240 may be specularly or diffusely reflective.

The reflective layer 240 includes at least one aperture 248 that extends through the reflective layer 240. The at least one aperture 248 of the reflective layer 240 is in substantial registration with at least one aperture 249 of the support layer 242 such that the LED 220 can be thermally, and in some embodiments electrically, connected to the thermally conductive substrate 212 as is further described herein.

The reflective layer 240 can include any suitable reflective material or materials, e.g., metal, polymeric, etc. For example, the reflective layer 240 can include aluminum, copper, silver, or combinations thereof.

In some embodiments, the reflective layer 240 can include a combination of metal and dielectric materials such that the combination is non-conductive, e.g., a combination of silver or aluminum and a polymer or inorganic oxide. Other such suitable combinations of metal and dielectric materials include one or more conductive particles, fibers, or other bodies made from silver, copper, aluminum, tin, indium, and gold coated in a layer or a continuous matrix of a dielectric material made from glass, inorganic oxides, condensation polymers such as polyethylene terephthalate, polyethylene naphthalate, saturated polymers such as polyolefins and polyfluoropolymers, and other polymers including epoxies, polystyrene, polycarbonate, polysilozanes, polyvinylstyrenes, polyacrylates, etc.

Further, in some embodiments, the reflective layer 240 includes a film having multiple polymer layers of alternating refractive index, e.g., those films described in U.S. Pat. No. 5,882,774 (Jonza et al.); U.S. Pat. No. 6,080,467 (Weber et al.); and U.S. Pat. No. 6,531,230 B1 (Weber et al.).

For diffuse reflection, the reflective layer 240 may be a white diffuse reflector such as a matrix containing diffusely reflecting particles, for example, titanium dioxide particles. In some embodiments, the diffusely reflective layer 240 can include a filled polymer. In general, filled polymers and paints contain an organic resin or binder and are typically opacified by loading with a suitable inorganic particle such as titania or barium sulfate. Further, a diffusely reflective layer 240 can include paints, enamels, inorganic powders, highly scattering white powders such as titania, or polytetrafluorethylene (PTFE). For example, enamels may be deposited as a slurry or powder coated (for example, electrophoretically) onto the support layer 242. Such enamel compositions are available that are compatible with thermally conductive materials such as copper or aluminum. Further, for example, PTFE may be deposited as a white powder or formed as a sheet and laminated to the metal substrate. The reflective layer 240 may also include a specularly reflective substrate with a diffusely reflective coating or film formed or attached thereon.

The reflective layer 240 can be attached to the first major surface 244 of the support layer 242, for example, using a pressure sensitive adhesive. Alternatively, the reflective layer 240 may be formed on the first major surface 244 using any suitable technique, e.g., chemical vapor deposition, plasma vapor deposition, sputtering, and vapor coating. For reflective layers that include aluminum, the aluminum may be deposited using physical vapor coating techniques, foil lamination, or plating onto the support layer 242. The aluminum may be coated with a protective material, or a reflectivity enhancing layer, or both, such as magnesium fluoride, or by anodizing followed by thermal and/or chemical treatment to seal any conductive pores in the aluminum oxide layer.

As mentioned herein, the reflective layer 240 includes at least one aperture 248 that is formed through the layer 240. In some embodiments, the aperture 248 of the reflective layer 240 and the aperture 249 of the support layer 242 are substantially registered with the LED 220 such that the LED 220 can be thermally and/or electrically connected to the thermally conductive substrate 212. The aperture 248 can be formed using any suitable technique depending upon the type of material or materials included in the reflective layer 240. For example, photolithography can be used to form aperture 248 in dielectric layers that include a photosensitive binder. An inorganic powder can be suspended in a photoresist solution (e.g., a solution containing polyvinyl alcohol and ammonium dichromate or gelatin dichromate). The suspension is coated onto the support layer 242, dried, and exposed through a mask. Unexposed areas are removed by rinsing with water, leaving behind the patterned coating. Powder coatings can be patterned photolithographically by coating the support layer 242 with a phototackifiable coating, exposing the coating through a mask, and then coating or dusting with the powder. Spray coating of powders or powders in a binder is also feasible. The powder coating can be patterned by using a mask that is aligned to the features to be coated.

For a reflective layer 240 that includes a film or laminated coating such as Vikuiti™ ESR film available from 3M Company, apertures may be formed by punching, die cutting, laser drilling, or flame perforation prior to attachment to the support layer 242. Apertures may also be formed in such films by etching through a patterned resist layer after the film has been attached to the support layer 242. In some embodiments, the aperture 248 can be formed by the LED 220 during the attachment process as is further described herein. In some embodiments, the aperture 248 of the reflective layer 240 and the aperture 249 of the support layer 242 can be formed at the same time.

Although the illumination assembly 200 illustrated in FIG. 3 includes a reflective layer 240, in some embodiments, it may be desirable that the reflective layer 240 exhibits low reflectivity. For example, low reflectivity layers may provide greater contrast for assemblies that include an array of individually addressable LEDs used, e.g., for active signage applications. For such active signs used in high ambient light conditions, low reflectivity at specific wavelengths may be tuned to the specific emission wavelength of the LED light sources so that the reflective layer is highly reflective at those wavelengths but absorptive over the broader spectrum, thereby providing an increase in light output while still reducing the amount of ambient light reflected by the layer.

Suitable materials for such low reflectivity layers include carbon filled polymers, especially low index polymers including polyolefins and fluorocarbons, and polymers filled with dyes or pigments or both. The polymer surfaces may be antireflective to reduce reflectivity. Suitable antireflection methods are interference coatings known in the art to reduce reflectivity, including suitably designed layers of high and low index materials, single layers of low index materials, boehmite made by hydrolyzing a thin coating of aluminum, solgel coatings, moth's-eye microstructured coatings, and graded index coatings. Also suitable are sintered coatings of absorbing materials.

Positioned between the reflective layer 240 and the first major surface 214 of the thermally conductive substrate 212 is the patterned conductive layer 250. The patterned conductive layer 250 is electrically isolated from the thermally conductive substrate 212. In the embodiment illustrated in FIG. 3, the patterned conductive layer 250 is positioned on a second major surface 246 of the support layer 242. The patterned conductive layer 250 includes conductors 252. Any suitable number of conductors 252 may be formed in or from the patterned conductive layer 250. The patterned conductive layer 250 may include any suitable electrically conductive material or materials. Such suitable materials include gold, copper, aluminum, and silver in either a pure form or in an alloy. The conductors 252 of the patterned conductive layer 250 may also be bare or insulated wires or strips.

The wires or strips may be laid in a single dimension array, or may be placed in an orthogonal array, or a three-wire control system. The orthogonal array or 3-wire control system may be used to provide logic signals to individual LEDs. For example, an LED may be electrically connected to an integrated circuit that acquires a signal and power from a two or three lead circuit, where the LED has a predetermined optical output in response to the control signal.

The patterned conductive layer 250 may be patterned using any suitable technique known in the art, e.g., chemical etching, photolithography, chemical vapor deposition, ink-jet printing, etc. In embodiments where the assembly 200 includes an array of LEDs, the patterned conductive layer 250 may be patterned such that each LED of the array is individually addressable.

The illumination assembly 200 of FIG. 3 also includes at least one LED 220 that is attached to the thermally conductive substrate 212. Any suitable number of LEDs can be included in assembly 200. In some embodiments, the assembly 200 can include an array of LEDs 220. Such an array may be arranged on the substrate 212 in a rectangular pattern or a square pattern. This leads to easy display of vertical and horizontal lines in an information display application. A rectangular or square pattern is not required, however, and the LEDs 220 may be laid out on the thermally conductive substrate 212 in some other pattern, e.g., a hexagonal pattern. Alternatively, the LEDs 220 can be randomly arrayed on the thermally conductive substrate 212.

The at least one LED 220 includes at least one LED die 222 electrically connected to a first electrode 226 and a second electrode 228. The LED 220 further includes an LED body 224 including a reflective surface 225. The LED die 222 is thermally connected to a post 230. All of the design considerations and possibilities described herein with respect to the LED die 22, body 24, first and second electrodes 26, 28, and the post 30 of the embodiment illustrated in FIG. 1 apply equally to the LED die 222, body 224, first and second electrodes 226, 228, and the post 230 of the embodiment illustrated in FIG. 3.

The at least one LED 220 is thermally connected to the thermally conductive substrate 212 through the post 230, which is positioned in the aperture 248 of the reflective layer 240 and the aperture 249 of the support layer 242. The post 230 may be in direct contact with the thermally conductive substrate 212. Alternatively, the post 230 may be thermally connected to the substrate 212 through a thermally conductive bonding material, e.g., curable polymer precursors such as acrylates, styrene, vinyl styrene, silanes, and epoxies that are filled with zinc oxide, sapphire, diamond, silicon carbide, or aluminum nitride.

The at least one LED 220 is electrically connected to the patterned conductive layer 250 through its first electrode 226 and second electrode 228. Any suitable technique may be used to electrically connect the LED 220 with the patterned conductive layer 250. For example, in the illustrated embodiment, the first and second electrodes 226, 228 of the LED 220 are electrically connected to the patterned conductive layer 250 through contacts 254. Such contacts 254 may be spring-loaded such that the first and second electrodes 226, 228 remain in non-bonded electrical connection with the contacts 254 when the LED 220 is attached to the substrate 212.

The at least one LED 220 may be thermally connected to the thermally conductive substrate 212 through the post 230. Any suitable technique may be used to attach the LED 220 to the thermally conductive substrate 212, e.g., ultrasonic welding, RF welding, thermosonic welding, bonding, soldering, laser welding, etc. For example, the LED 220 may be ultrasonically welded to the thermally conductive substrate 212. Ultrasonic welding is typically used to join multiple parts together using vibrations converted into heat energy. Common types of ultrasonic welding are plunge and continuous welding, for example, scan or rotary welding. In plunge welding, an ultrasonic horn plunges (travels towards the parts) and transmits vibrations into a top part. In continuous welding, the ultrasonic horn is typically stationary or rotating and the part is moved beneath it. Each of the ultrasonic welding types involves a horn.

All horns impart energy to the parts to be welded at a selected wavelength, frequency, and amplitude. A rotary horn includes a shaft with input and output ends, and a welding portion mounted on and coaxial with the output end. The diameter of the welding portion is typically greater than the diameter of the shaft. The welding portion has a cylindrical weld face having a diameter that expands and contracts with the application of vibration energy. Typically, a rotary horn is cylindrical and rotates about a longitudinal axis. The input vibration is in the axial direction and the output vibration is in the radial direction. The horn and anvil are close to each other, and the anvil can rotate in the opposite direction of the horn. The part (or parts) to be welded passes between the cylindrical surfaces at a linear velocity, equal to the tangential velocity of the cylindrical surfaces. Matching the tangential velocities of the horn and the anvil with the linear velocity of the material tends to minimize the drag between the horn and the material.

Any suitable ultrasonic welding apparatus and technique may be used to attach the LED 220 to the thermally conductive substrate 212. In general, the post 230 of LED 220 is positioned proximate the thermally conductive substrate 212. Ultrasonic energy is applied to the LED 220 such that the heat generated by the ultrasonic energy causes the post 230 to attach to the thermally conductive substrate 212.

In typical backlit displays where illumination assemblies are positioned within or proximate an optical cavity, light emitted by LEDs or other light sources may experience several reflections off of the circuit board substrate. Such circuit board substrates may be manufactured with a highly reflective coating on the circuit board, including, for example, a titania filled coating or a reflective film. Either of these types of reflectors need to be patterned for the LED to make electrical and thermal contact with the circuit board. This patterning is typically expensive, and, because of the nature of the circuit board, may still have poor thermal conductivity from the LED junction to the board. In the assemblies of the present disclosure, the reflective dielectric layer need not be pre-patterned with an aperture.

Instead, the process of ultrasonically bonding, for example, the LED 220 to the substrate 212 can cause a portion of the reflective layer 240 to be removed such that the post 230 comes into contact with and attaches to the substrate 212. This can significantly reduce the cost incurred by patterning another type of reflective layer. A thin coating of non-oxidizing material such as gold can be used on one or both of the post 230 and the thermally conductive substrate 212 to enhance environmental stability of the electrical interface.

Thermally and electrically conductive adhesives, solder re-flow, and Au/Sn eutectic bonding are among other techniques that can be used to attach the LED 220 to the thermally conductive substrate 212. Solder typically has a lower thermal resistance than an adhesive, but not all LEDs have solderable base metallization. Solder attachment also has the advantage of LED self-alignment, due to the surface tension of the molten solder aligning the LED during processing. However, some LEDs may be sensitive to solder reflow temperatures, making an adhesive more appropriate. Lower temperature solders known in the art can be used for assemblies where good thermal conductivity is essential but conventional reflow temperatures of greater than 200° C. cannot be tolerated.

In some embodiments, the at least one LED 220 may be both thermally and electrically connected to the thermally conductive substrate 212 through the post 230. In other words, one or both of the electrodes for the LED die 222 may be electrically connected to the post 230. In such an embodiment, the thermally conductive substrate 212 becomes a common connection for the one or more LEDs 220 that are attached to the substrate 212. Thus, in addition to conducting heat away from the LED 220, the thermally conductive substrate 212 is also an active element of the electrical circuits of the illumination assembly 200. For example, the thermally conductive substrate 212 may provide a common electrical ground to each of the LEDs 220 in the assembly 200. Further, when the thermally conductive substrate 212 is composed of a material or materials having good electrical conductivity, additional benefits including an even current distribution with low voltage drop and EMI shielding may be achieved. Any suitable technique can be used to electrically connect one or both electrodes of the LED die 222 to the post 230, e.g., those techniques described in co-owned and copending U.S. patent application entitled ILLUMINATION ASSEMBLY AND METHOD OF MAKING SAME Ser. No. 11/018,605.

As mentioned herein, any suitable technique may be utilized to attach the LEDs of the present disclosure with the thermally conductive substrate. In some embodiments, the post of the LED can be attached or bonded to the substrate before the LED body is attached to the post. For example, the post 230 can include one or more threads for threading the LED body 224 onto the post 230. To facilitate attachment to the post 230, the LED body 224 may also include threads to mate with the threads of post 230.

In general, the at least one LED 220 may be attached to the thermally conductive substrate 212 by first attaching the post 230 to the substrate 212 using any suitable technique, e.g., ultrasonic welding. If the reflective layer 240 includes aperture 248 and support layer 242 includes aperture 249, then the post 230 is brought into thermal connection with the substrate 212 through the apertures 248, 249. In other embodiments, the apertures 248, 249 may be formed through the reflective layer 240 and support layer 242 during the attachment process. After the post 230 is attached to the substrate 212, the LED body 224 may be attached to the post 230 using any suitable technique. In one embodiment, the LED body 224 is threaded onto the post 230 until the first electrode 226 and the second electrode 228 are electrically connected to the patterned conductive layer 250 through contacts 254. Alternatively, if the post 230 does not include threads, then the LED body 224 can be friction-fit onto the post 230, or the LED body 224 can include retention protuberances or other devices known in the art for attachment to the post 230.

The support layer 242 is separated from the first major surface 214 of the thermally conductive substrate 212 by standoffs 216. Such standoffs 216 can be any suitable material or materials that can support the support layer 242 and allow the patterned conductive layer 250 to be electrically isolated from the thermally conductive substrate 212. In some embodiments, the standoffs 216 can be formed in the thermally conductive substrate 212 and extend from the first major surface 214 of the substrate 212. Any suitable technique may be used to form standoffs 216, e.g., knurling, embossing, etching, polishing, etc.

The support layer 242 is separated from the first major surface 214 of the thermally conductive substrate 212 by standoffs 252. Such standoffs 252 can be any suitable material or materials that can support the support layer 242 and allow the patterned conductive layer 250 to be electrically isolated from the thermally conductive substrate 212. In some embodiments, the standoffs 216 can be formed in the thermally conductive substrate 212 and extend from the first major surface 214 of the substrate 212. Any suitable technique may be used to form standoffs 252, e.g., knurling, embossing, etching, polishing, etc.

In general, the illumination assembly 200 of FIG. 3 may be manufactured using any suitable technique. For example, the patterned conductive layer 250 may be formed on the second major surface 246 of the support layer 242, and the reflective layer 240 may be formed on the first major surface 244 of the support layer 242 before the support layer 242 is placed on standoffs 216 of the thermally conductive substrate 212. Further, the at least one LED 220 may also be electrically connected to the patterned conductive layer 250 prior to placement of the support layer 242. The support layer 242 may be in non-bonded contact with standoffs 216, or the support layer 242 may be attached to the standoffs 216 using any suitable technique, adhering, welding, soldering, etc. In some embodiments, the support layer 242 may include openings that are registered with the standoffs 216 such that a portion of some or all of the standoffs 216 are positioned in such openings.

Alternatively, the support layer 242 and the patterned conductive layer 250 may be placed on standoffs 216 and then the reflective layer 240 may be formed on the first major surface 244 of the support layer 242. Further, the at least one LED 220 may be attached to the thermally conductive substrate 212 after the support layer 242, patterned conductive layer 250, and reflective layer 240 have been positioned proximate the first major surface 214 of the thermally conductive substrate 212.

Figure 4:
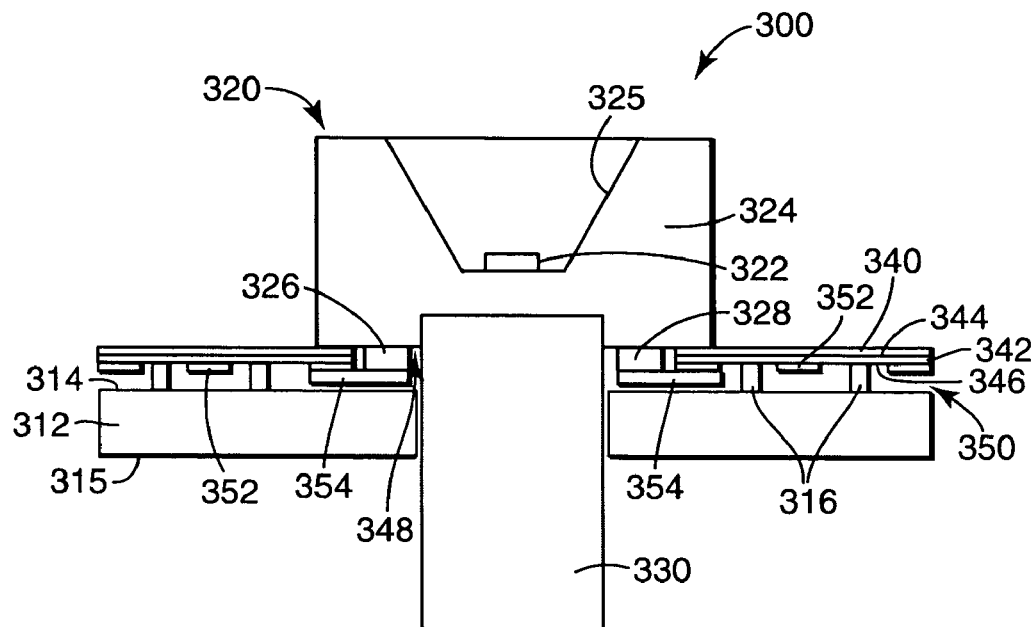
FIG. 4 is a schematic cross-section view of another embodiment of an illumination assembly.

As mentioned herein, any suitable technique may be used to attach the LEDs of the present disclosure to the thermally conductive substrate. For example, an LED can include a post having a portion that is embedded in the thermally conductive substrate. For example, FIG. 4 is a schematic cross-section view of an illumination assembly 300. The assembly 300 includes a thermally conductive substrate 312, a reflective layer 340 proximate a first major surface 314 of the thermally conductive substrate 312, a patterned conductive layer 350 positioned between the reflective layer 340 and the first major surface 314, and at least one LED 320. The assembly 300 also includes a support layer 342 having a first major surface 344 and a second major surface 346 that is separated from the first major surface 314 of the thermally conductive substrate 312 by standoffs 316. The reflective layer 340 is positioned on the first major surface 344 of the support layer 342. Further, the patterned conductive layer 350 is positioned on the second major surface 346 of the support layer 342. All of the design considerations and possibilities described herein with respect to the thermally conductive substrate 212, the reflective layer 240, the patterned conductive layer 250, the support layer 242, and the at least one LED 220 of the embodiment illustrated in FIG. 3 apply equally to the thermally conductive substrate 312, the reflective layer 340, the patterned conductive layer 350, the support layer 342, and the at least one LED 320 of the embodiment illustrated in FIG. 4.

The at least one LED 320 includes a post 330, an LED die 322, an LED body 324, and a reflective surface 325. The LED 320 also includes first and second electrodes 326, 328. At least a portion of the post 330 is embedded in the thermally conductive substrate 312. In some embodiments, the post 330 is embedded such that a first end 332 of the post 330 is located within the thermally conductive substrate 312. In other embodiments, the post 330 is embedded such that the first end 332 is outside of the second major surface 315 of the thermally conductive substrate 312 as is illustrated in the embodiment of FIG. 4. By embedding at least a portion of the post 330 into the thermally conductive substrate 312, the surface area of the post 330 that is in contact with the thermally conductive substrate 312 is greater than if the post 330 were only in contact with the first major surface 314 of the substrate 312. This increased contact can improve thermal conductivity.

Further, the portion of the post 330 that extends beyond the second major surface 315 of the thermally conductive substrate 312 can provide additional heat dissipation into ambient air, forced air, liquid cooling, or other suitable heat dissipation techniques.

The at least one LED 320 may be thermally connected to the thermally conductive substrate 312 through the post 330. Any suitable technique may be used to attach the LED 320 to the thermally conductive substrate 312. For example, an indentation or opening can be formed in the thermally conductive substrate 312, and the post 330 of the LED 320 press-fit into the indentation. The LED 320 remains attached to the thermally conductive substrate 312 by friction between the post 330 and the substrate 312. Any suitable technique may be used to form an indentation or opening in the substrate 312, e.g., knurling, embossing, etching, ablating, punching, etc.

Alternatively, the at least one LED 320 can be attached to the substrate 312 by piercing the substrate 312 with the post 330 without first forming an indentation or hole in the substrate 312. To facilitate piercing of the substrate 312, the post 330 can include a pointed or sharpened first end 332.

As mentioned herein, any suitable technique may be utilized to attach the LEDs of the present disclosure with the thermally conductive substrate. In some embodiments, the post without the LED body can be attached to the substrate and then the LED body can be attached to the post.

In general, the LED 320 may be attached to the thermally conductive substrate 312 by first attaching the post 330 to the substrate 312 using any suitable technique, e.g., press-fitting, piercing, screwing, etc. If the reflective layer 340 includes aperture 348 and the support layer 342 includes aperture 349, then the post 330 is positioned in the apertures 348, 349 and brought into thermal connection with the substrate 312. In other embodiments, the apertures 348, 349 may be formed through the reflective layer 340 and support layer 342 during the attachment process as is further described herein. After the post 330 is attached to the substrate 312, the LED body 324 may be attached to the post 330 using any suitable technique. In one embodiment, the LED body 324 and the post 330 include threads such that the body 324 can be threaded onto the post 330 until the first electrode 326 and the second electrode 328 are electrically connected to the patterned conductive layer 350 through contacts 354. Alternatively, the LED body 324 can be friction-fit onto the post 330, or the LED body 324 can include retention protuberances or other devices known in the art for attachment.

Any suitable device or technique can be used to prevent the LED 320 from becoming detached from the thermally conductive substrate 312. For example, the post 330 can include one or more protuberances to help fixedly attach the LED 320 to the substrate 312. In other embodiments, the post 330 can include one or more threads for threading or screwing the LED 320 into the thermally conductive substrate 312 as described in co-owned and copending U.S. patent application entitled ILLUMINATION ASSEMBLY AND METHOD OF MAKING SAME Ser. No. 11/018,605.

Figure 5:
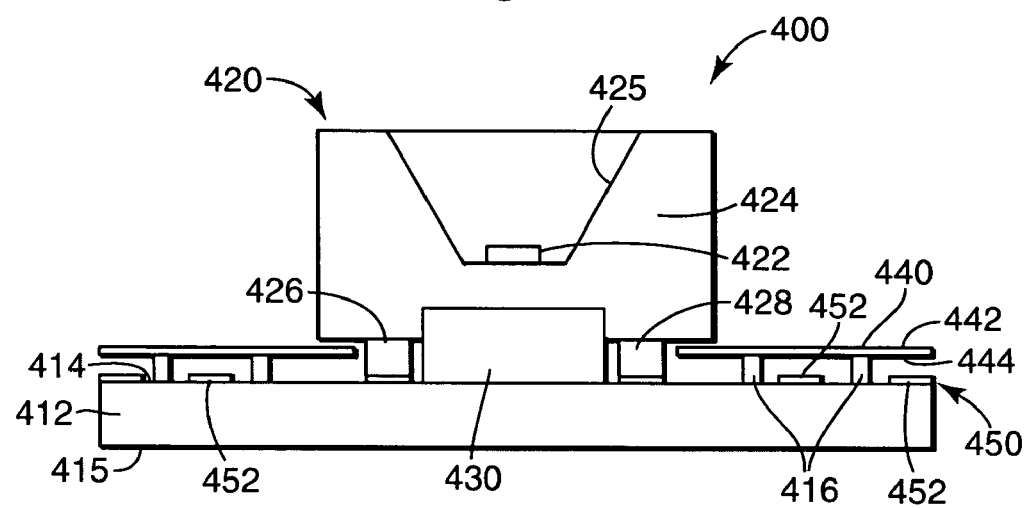
FIG. 5 is a schematic cross-section view of another embodiment of an illumination assembly.

In some embodiments, a support layer may not be required. For example, FIG. 5 is a schematic cross-section view of another embodiment of an illumination assembly 400. The assembly 400 includes a thermally conductive substrate 412, a reflective layer 440 positioned proximate a first major surface 414 of the thermally conductive substrate 412, a patterned conductive layer 450 positioned between the reflective layer 440 and the first major surface 414, and at least one LED 420. All of the design considerations in regard to the thermally conductive layer 212, the reflective layer 240, the patterned conductive layer 250, and the at least one LED 220 of the embodiment illustrated in FIG. 3 apply equally to the thermally conductive layer 412, the reflective layer 440, the patterned conductive layer 450, and the at least one LED 220 of the embodiment illustrated in FIG. 5.

In FIG. 5, the assembly 400 does not include a support layer (e.g., support layer 242 of FIG. 3). Instead, the reflective layer 440 is positioned on standoffs 416 that are positioned between the first major surface 414 of the thermally conductive layer 412 and the reflective layer 440. The reflective layer 440 may be laid on the standoffs 416, or the reflective layer 440 may be attached to the standoffs using, e.g., an adhesive. Any suitable reflective layer described herein may be used with the assembly 400 of FIG. 5.

Further, unlike the embodiment of FIG. 3, the patterned conductive layer 450 is positioned on the first major surface 414 of the thermally conductive substrate 412. Those skilled in the art will understand that, to prevent the patterned conductive layer 450 from coming into electrical contact with the thermally conductive substrate 412, a dielectric layer may be required between the patterned conductive layer 450 and the thermally conductive substrate 412. Any suitable dielectric layer may be utilized. Further, any suitable technique may be used to form such a dielectric layer on the first major surface 414 of the thermally conductive substrate 412, e.g., chemical vapor deposition, sputtering, etc.

The patterned conductive layer 450 may be any suitable type of conductive layer, e.g., patterned conductive layer 250 of FIG. 3. For example, the patterned conductive layer 450 can include a metallic mesh that is laid onto or attached to the first major surface 414 of the thermally conductive substrate 412.

In some embodiments, for reflective layers that are non-conductive (i.e., dielectric layers), the standoffs 416 may not be required. Instead, a reflective dielectric layer 440 may be positioned directly on the patterned conductive layer 450.

In the embodiment illustrated in FIG. 5, the at least one LED 420 is electrically connected to the patterned conductive layer 450 through first and second electrodes 426, 428. Such electrodes 426, 428 are electrically connected to conductors 452 of the patterned conductive layer 450. Any suitable technique may be used to electrically connect the LED 420 with the patterned conductive layer 450. For example, the first and second electrodes 426, 428 may be ultrasonically bonded to conductors 452. Alternatively, the LED 420 may be attached to the thermally conductive substrate 412 such that the first and second electrodes 426, 428 remain in non-bonded electrical connection with conductors 452. In other embodiments, the first and second electrodes 426, 428 may be soldered to conductors 452.

Any suitable LED or LEDs may be used with the assembly 400 of FIG. 5. For example, the assembly 400 can include an LED that includes a post a portion of which is embedded in the thermally conductive substrate 412 (e.g., LED 320 of FIG. 4). Such an LED may be attached to the thermally conductive substrate using any suitable technique, e.g., press-fitting, piercing, screwing, etc. Further, such a post may have a first end that extends beyond the second major surface 415 of the thermally conductive substrate 412 similar to the embodiment illustrated in FIG. 4.

Figure 6:
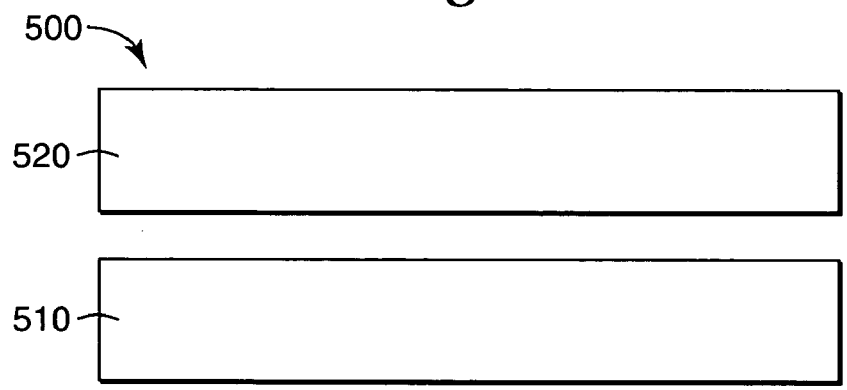
FIG. 6 schematically illustrates one embodiment of a display.

The illumination assemblies of the present disclosure may be used in any suitable manner for providing illumination. For example, some or all of the illumination assemblies described herein may be used to provide illumination for displays. FIG. 6 schematically illustrates a display assembly 500 that includes an illumination assembly 510 optically coupled to a display device 520. The illumination assembly 510 may include any illumination assembly described herein, e.g., illumination assembly 200 of FIG. 3. The illumination assembly 510 provides illumination light to the display device 520. The display device 520 may be any suitable display device, e.g., electrochromatic or electrophoretic devices, spatial light modulator(s), transmissive signs, etc.

For example, the display device 520 may include one or more spatial light modulators. In some embodiments, the one or more spatial light modulators may include an array of individually addressable controllable elements. Such spatial light modulators may include a suitable type of controllable element. For example, the spatial light modulator may include a variable-transmissivity type of display. In some embodiments, the spatial light modulator may include a liquid crystal display (LCD), which is an example of a transmission-type light modulator. In some embodiments, the spatial light modulator may include a deformable mirror device (DMD), which is an example of a reflection-type light modulator.

The display device 520 may include any suitable optical and non-optical elements for producing a display image, e.g., lenses, diffusers, polarizers, filters, beam splitters, brightness enhancement films, etc. The illumination assembly 510 may be optically coupled to the display device 520 using any suitable technique known in the art.

In some embodiments, the display device 520 may be directly lit by the illumination assembly 510 In other words, the display device 520 can be positioned between the illumination assembly 510 and a viewing position, e.g., those direct-lit displays described in U.S. Patent Publication No. 2004/0228106 (Stevenson et al.). In other embodiments, the display device 520 may be side-lit by the illumination assembly 510, i.e., light from the illumination assembly 510 is directed through one or more sides of the display device 520 that are substantially orthogonal to the output surface of the device 520. Such side-lit embodiments may include those systems described in U.S. Patent Publication No. 2004/0228106 (Stevenson et al.).

All references and publications cited herein are expressly incorporated herein by reference in their entirety into this disclosure. Illustrative embodiments of this disclosure are discussed and reference has been made to possible variations within the scope of this disclosure. These and other variations and modifications in the disclosure will be apparent to those skilled in the art without departing from the scope of the disclosure, and it should be understood that this disclosure is not limited to the illustrative embodiments set forth herein. Accordingly, the disclosure is to be limited only by the claims provided below.

What is claimed is:

1. An illumination assembly, comprising:
   a thermally conductive substrate comprising a first major surface;
   a reflective layer proximate the first major surface of the thermally conductive substrate;
   a patterned conductive layer positioned between the reflective layer and the first major surface of the thermally conductive substrate and electrically isolated from the thermally conductive substrate; and
   at least one LED comprising a post that is attached to the thermally conductive substrate, wherein the at least one LED is thermally connected to the thermally conductive substrate through the post and electrically connected to the patterned conductive layer.

2. The assembly of claim 1, wherein the at least one LED is attached to the first major surface of the thermally conductive substrate.

3. The assembly of claim 1, wherein at least a portion of the post is embedded in the thermally conductive substrate.

4. The assembly of claim 3, wherein the post comprises a first end that extends beyond a second major surface of the thermally conductive substrate.

5. The assembly of claim 1, wherein the reflective layer comprises multiple polymer layers of alternating refractive index.

6. The assembly of claim 1, wherein the assembly further comprises a support layer comprising a first major surface, a second major surface, and at least one aperture, wherein the reflective layer comprises at least one aperture, wherein the reflective layer is positioned on the first major surface of the support layer such that the at least one aperture of the reflective layer is in substantial registration with the at least one aperture of the support layer, and further wherein the patterned conductive layer is positioned on the second major surface of the support layer.

7. The assembly of claim 6, wherein the assembly further comprises a plurality of standoffs positioned between the first major surface of the thermally conductive substrate and the support layer, wherein the support layer and the patterned conductive layer are spaced apart from the first major surface of the thermally conductive substrate by the plurality of standoffs.

8. The assembly of claim 7, wherein the plurality of standoffs are formed in the thermally conductive substrate and extend from the first major surface of the thermally conductive substrate.

9. The assembly of claim 1, wherein the assembly further comprises a dielectric layer formed on the first major surface of the thermally conductive substrate, and further wherein the dielectric layer is disposed between the patterned conductive layer and the thermally conductive substrate.

10. The assembly of claim 1, wherein the thermally conductive substrate is also electrically conductive, and further wherein the at least one LED is electrically connected to the thermally and electrically conductive substrate through the post.

11. The assembly of claim 1, wherein the assembly comprises an array of LEDs.

12. A method of making an illumination assembly, comprising:
providing a thermally conductive substrate comprising a first major surface;
positioning a patterned conductive layer proximate the first major surface of the thermally conductive substrate such that the patterned conductive layer is electrically isolated from the thermally conductive substrate;
positioning a reflective layer such that the patterned conductive layer is between the reflective layer and the first major surface;
providing at least one LED comprising a post; and
attaching the at least one LED to the thermally conductive substrate such that the at least one LED is adjacent the reflective layer, wherein the at least one LED is thermally connected to the thermally conductive substrate through the post and electrically connected to the patterned conductive layer.

13. The method of claim 12, wherein attaching the at least one LED comprises press-fitting the post into the thermally conductive substrate.

14. The method of claim 12, wherein attaching the at least one LED comprises piercing the thermally conductive substrate with the post.

15. The method of claim 12, wherein attaching the at least one LED comprises ultrasonically bonding the at least one LED to the first major surface of the thermally conductive substrate.

16. The method of claim 12, wherein the post comprises a threaded post, wherein attaching the at least one LED comprises screwing the threaded post into the thermally conductive substrate.

17. The method of claim 12, wherein attaching the at least one LED further comprises:
forming at least one aperture in the reflective layer; and
positioning the post of the at least one LED in the at least one aperture.

18. The method of claim 17, wherein forming the at least one aperture comprises removing a portion of the dielectric layer with the post.

19. The method of claim 12, further comprising providing a support layer comprising a first major surface and a second major surface, wherein the second major surface of the support layer is positioned proximate the first major surface of the thermally conductive substrate, and further wherein the reflective layer is positioned on the first major surface of the support layer and the patterned conductive layer is positioned on the second major surface of the support layer.

20. The method of claim 19, further comprising providing a plurality of standoffs between the first major surface of the thermally conductive substrate and the support layer, wherein the support layer is positioned on the plurality of standoffs such that the support layer is spaced apart from the first major surface of the thermally conductive substrate.

21. The method of claim 20, wherein providing the plurality of standoffs comprises embossing the plurality of standoffs in the first major surface of the thermally conductive substrate.

22. The method of claim 19, wherein positioning the reflective layer comprises attaching a polymeric multilayer optical film to the first major surface of the support layer.

23. The method of claim 12, further comprising forming a dielectric layer on the first major surface of the thermally conductive substrate, wherein positioning the patterned conductive layer comprises forming the patterned conductive layer on the dielectric layer such that the dielectric layer is between the conductive layer and the first major surface of the thermally conductive substrate.

24. A display, comprising:
An illumination assembly, comprising:
a thermally conductive substrate comprising a first major surface;
a reflective layer proximate the first major surface of the thermally conductive substrate;
a patterned conductive layer positioned between the reflective layer and the first major surface of the thermally conductive substrate and electrically isolated from the thermally conductive substrate; and
at least one LED comprising a post that is attached to the thermally conductive substrate, wherein the at least one LED is thermally connected to the thermally conductive substrate through the post and electrically connected to the patterned conductive layer; and
a spatial light modulator optically coupled to the illumination assembly, wherein the spatial light modulator comprises a plurality of controllable elements operable to modulate at least a portion of light from the illumination assembly.

25. The display of claim 24, wherein the plurality of controllable elements of the spatial light modulator comprises liquid crystal display elements.

* * * * *

UNITED STATES PATENT AND TRADEMARK OFFICE
CERTIFICATE OF CORRECTION

| | | |
|---|---|---|
| PATENT NO. | : 7,296,916 B2 | Page 1 of 2 |
| APPLICATION NO. | : 11/018961 | |
| DATED | : November 20, 2007 | |
| INVENTOR(S) | : Andrew J. Ouderkirk | |

It is certified that error appears in the above-identified patent and that said Letters Patent is hereby corrected as shown below:

<u>Column 1</u>
Line 8, After "SAME" insert -- (Attorney Docket No. 60116US002) --.
Line 10, After "SAME" insert -- (Attorney Docket No. 60159US002) --.

<u>Column 12</u>
Line 3, After "SAME" insert -- (Attorney Docket No. 60159US002) --.

Line 33, Below "post 230." insert -- The support layer 242 of the illumination assembly 200 can include any suitable material or materials that provide a supporting structure for the reflective layer 240 and the patterned conductive layer 250, e.g., metal, polymeric, etc. In some embodiments, the support layer 242 can include dielectric materials such that the patterned conductive layer 250 does not become electrically connected with a conductive reflective layer 240. Further, in some embodiments, the support layer 242 and the conductive layer 250 can include a printed circuit board (PCB) that has the reflective layer 240 positioned on the surface 244 opposite the patterned conductive layer 250. --.

Line 44, Below "polishing, etc." delete "The support layer 242 is separated from the first major surface 214 of the thermally conductive substrate 212 by standoffs 252. Such standoffs 252 can be any suitable material or materials that can support the support layer 242 and allow the patterned conductive layer 250 to be electrically isolated from the thermally conductive substrate 212. In some embodiments, the standoffs 216 can be formed in the thermally conductive substrate 212 and extend from the first major surface 214 of the substrate 212. Any suitable technique may be used to form standoffs 252, e.g., knurling, embossing, etching, polishing, etc.".

UNITED STATES PATENT AND TRADEMARK OFFICE
CERTIFICATE OF CORRECTION

| | |
|---|---|
| PATENT NO. | : 7,296,916 B2 |
| APPLICATION NO. | : 11/018961 |
| DATED | : November 20, 2007 |
| INVENTOR(S) | : Andrew J. Ouderkirk |

It is certified that error appears in the above-identified patent and that said Letters Patent is hereby corrected as shown below:

Column 14
Line 48, After "SAME" insert -- (Attorney Docket No. 60159US002) --.

Signed and Sealed this

Twenty-sixth Day of August, 2008

JON W. DUDAS
*Director of the United States Patent and Trademark Office*